United States Patent
Lechthaler et al.

(10) Patent No.: US 8,926,722 B2
(45) Date of Patent: Jan. 6, 2015

(54) CUTTING TOOLS WITH AL—CR—B—N/TI—AL—N MULTILAYER COATINGS

(75) Inventors: Markus Lechthaler, Feldkirch (AT); Christian Tritremmel, Neckenmarkt (AT)

(73) Assignee: Oerlikon Trading AG, Truebbach, Truebbach (CH)

( * ) Notice: Subject to any disclaimer, the term of this patent is extended or adjusted under 35 U.S.C. 154(b) by 82 days.

(21) Appl. No.: 13/575,358

(22) PCT Filed: Jan. 25, 2011

(86) PCT No.: PCT/EP2011/000295
§ 371 (c)(1),
(2), (4) Date: Nov. 19, 2012

(87) PCT Pub. No.: WO2011/095292
PCT Pub. Date: Aug. 11, 2011

(65) Prior Publication Data
US 2013/0052477 A1    Feb. 28, 2013

Related U.S. Application Data

(60) Provisional application No. 61/301,336, filed on Feb. 4, 2010.

(51) Int. Cl.
*C23C 14/06* (2006.01)
*C23C 28/04* (2006.01)
*C23C 30/00* (2006.01)

(52) U.S. Cl.
CPC ......... *C23C 14/0641* (2013.01); *C23C 14/0647* (2013.01); *C23C 28/04* (2013.01); *C23C 30/005* (2013.01)
USPC ............... 51/307; 51/309; 428/216; 428/336; 428/697; 428/698; 428/699; 428/704

(58) Field of Classification Search
USPC ............ 51/307, 309; 428/216, 336, 697, 698, 699, 704
See application file for complete search history.

(56) References Cited

U.S. PATENT DOCUMENTS

| 7,166,155 | B2 * | 1/2007 | Ishikawa | 428/697 |
| 7,226,670 | B2 * | 6/2007 | Derflinger et al. | 428/699 |
| 7,901,796 | B2 * | 3/2011 | Fukui et al. | 428/697 |
| 7,947,363 | B2 * | 5/2011 | Xu et al. | 51/309 |
| 8,481,145 | B2 * | 7/2013 | Ohtomo | 51/307 |
| 2005/0170162 | A1 | 8/2005 | Yamamoto et al. | |

FOREIGN PATENT DOCUMENTS

| EP | 1726686 A1 | 11/2006 |
| EP | 1842610 A1 | 10/2007 |
| EP | 2100985 A1 | 9/2009 |
| JP | 2005-330539 | * 12/2005 |
| JP | 2009-012139 A | 1/2009 |
| WO | 2006/084404 A1 | 8/2006 |
| WO | 2008/037556 A2 | 4/2008 |
| WO | 2008/116728 A2 | 10/2008 |
| WO | 2009/079184 A2 | 6/2009 |

OTHER PUBLICATIONS

International Search Report for PCT/EP2011/000295 dated Mar. 16, 2011.

* cited by examiner

*Primary Examiner* — Archene Turner
(74) *Attorney, Agent, or Firm* — Pearne & Gordon LLP

(57) ABSTRACT

The present invention relates to a multilayer coating system deposited on at least a portion of a solid body surface and containing in the multilayer architecture Al—Cr—B—N individual layers deposited by means of a physical vapor deposition method characterized in that in at least a portion of the overall thickness of the multilayer coating system the Al—Cr—B—N individual layers are combined with Ti—Al—N individual layers, wherein the Al—Cr—B—N and Ti—Al—N individual layers are deposited alternately one on each other, and wherein the thickness of the Al—Cr—B—N individual layers is thicker than the thickness of the Ti—Al—N individual layers, and thereby the residual stress of the multilayer coating system is considerably lower in comparison to the residual stress of the corresponding analogical Al—Cr—B—N monolayer coating.

20 Claims, No Drawings

CUTTING TOOLS WITH AL—CR—B—N/TI—AL—N MULTILAYER COATINGS

The present invention relates to coatings deposited by means of physical vapour deposition methods. These coatings are based principally on nitrides of aluminium, chromium and boron and possess improved wear resistance. Furthermore these coatings may particularly be applied on cutting tools.

According to the present invention Al—Cr—B—N films are part of a multilayer coating architecture.

STATE OF THE ART

Both Ti—Al—N and Cr—Al—N are well-established wear resistant coating systems. On the one side Ti—Al—N is e.g. widely used for machining of hardened steel. It is structurally stable up to about 900° C. in the presence of oxygen. However Ti—Al—N loses hardness significantly at temperatures higher than 600° C. On the other side Cr—Al—N has, at least after hot temperature applications in oxygen atmosphere a higher hardness than Ti—Al—N and a much better oxidation resistance. Cr—Al—N is even structurally stable up to 1100° C. in the presence of oxygen. However, in comparison with other coatings Cr—Al—N does not improve essentially the performance of coated cutting tools in machining hardened steels.

Because of the very interesting properties of the nitrides of titanium and aluminium and the nitrides of chromium and aluminium many new designs of coating systems still include these nitrides or are based on them.

The document WO2006084404 discloses a coating system designed to be especially used as a hard coating with extremely high oxidation resistance for protecting cutting tools that also require wear protection. The described coating system comprises at least a main layer on a surface of a substrate, a buried layer and an outer surface layer, wherein the surface layer comprises AlCrZ, where Z can be N, C, B, CN, BN, CBN, NO, CO, BO, CNO, BCNO or CBNO. The buried layer comprises any one of the following materials or their combinations: a metal nitride, carbide or carbonitride a metal silicon nitride, carbide, or carbonitride, wherein the metal is at least one transition metal of the IVB, VB or VIB group or a multilayer of the materials or a material or a combination or a multilayer of the materials comprising at least one metal or carbon, preferably a diamond like carbon layer. The main layer comprises a nitride, carbide or carbonitride or a multilayer of nitride, carbide or carbonitride material. The main layer can be deposited on the workpiece either directly or via an interjecting adhesion layer, which can be an aforementioned transition metal or metal nitride, preferably AlCr, AlTi, Cr, Ti, AlCrN, AlTiN, TiN or CrN.

Likewise in WO2008037556 is disclosed an AlCrN-based coating system that also contemplate a combination with TiAlN. More exactly following is disclosed in document WO2008037556: a coating system for improving wear resistance consisting of at least one layer with the following composition: $(Al_{1-a-b-c}Cr_aB_bZ_c)X$, where X is at least one of N, C, CN, NO, CO, CNO and Z is at least one of W, Mo, Ta, Cb (also referred to Nb) and wherein there is valid $0.2 \leq a \leq 0.5$, $0.01 \leq b \leq 0.2$ and $0.001 \leq c \leq 0.04$. Furthermore it is disclosed that the addressed at least one AlCrBZX layer may thereby be applied directly on the surface of the workpiece body or may be applied to form the outermost layer of the coating system. Likewise it is mentioned that the at least one AlCrBZX layer may be embedded within a multilayer system between a first layer subsystem towards the surface of the workpiece body and a second layer subsystem towards the surface of the coated body. Still further it is mentioned that in a multilayer system more than one of the addressed AlCrBZX layers of equal or of varying stoichiometry and/or material composition may be provided. Thereby, such layers of AlCrBZX type may reside directly one upon the other with different stoichiometry and/or material composition or may be separated by respective coating layer subsystems. Furthermore it is disclosed that the coating system may comprise at least one interlayer of $(Ti_dAl_e)N$ or $(Cr_fAl_g)N$ between the substrate and the outermost layer, where $0.4 \leq d$ $0.6$, $0.4 \leq e \leq 0.6$, $0.4 \leq f \leq 0.7$ and $0.3 \leq g \leq 0.6$. Thereby the addressed TiAlN or CrAlN interlayer may be provided so that it is one layer of a multilayer subsystem between the surface of the body and the AlCrBZX layer. Furthermore the coating system may comprise a multiyayer of alternating layers of at least one of the addressed interlayers and of at least one of the AlCrBZX layers.

Furthermore, document JP2009012139 discloses a cutting tool whose surface is coated with a hard AlCrBN coating layer that possess a layer thickness of 0.8-5 µm. It is mentioned that the described AlCrBN coating layer provides high hardness, excellent lubricity and wear resistance in high speed cutting of materials with high weld ability. The disclosed AlCrBN coating consists of a first film deposited on the substrate surface having a composition of $(Al_XCr_{1-X}B_Y)N_z$ with $0.5 \leq X \leq 0.7$, $0.001 \leq Y \leq 0.1$, $0.9 \leq Z \leq 1.25$, $X+Y<0.75$ and a second film deposited on the first film having a composition of $(Al_aCr_{1-a}B_b)N_c$ with $0.4 \leq a \leq 0.7$, $1 \leq b \leq 2.5$, $0.25 \leq c \leq 0.68$. The overall coating has an average composition of $Al_\alpha Cr_{1-\alpha} B_\beta N_\gamma$ where $0.55 \leq \alpha \leq 0.7$, $0.003 \leq \beta \leq 0.12$, $0.8 \leq \gamma \leq 1.25$.

OBJECTIVE OF THE INVENTION

The inventors observed that effectively single layer coatings of Al—Cr—B—N exhibit improved hardness and tribological behaviour in comparison to the well-established Al—Cr—N coatings. However there is still a need for further improvement. Al—Cr—B—N coatings exhibit in spite of their interesting properties also a very high residual stress. It worsens the cutting performance of the tools coated with these promising coating films. That is especially disadvantageous in applications requiring high coating thicknesses where particularly low residual stresses in the coatings are required in order to avoid coating delamination.

It is an objective of the present invention to provide coatings which exhibit a low residual stress, an enhanced hardness and improved wear coefficients as compared to Al—Cr—N and Al—Cr—B—N monolayer coatings.

DESCRIPTION OF THE INVENTION

In order to attain reduced residual stresses in Al—Cr—B—N coatings different multilayer structures were synthetized by means of physical vapour deposition processes, preferably using reactive cathodic arc ion plating deposition methods.

The inventors surprisingly observed that the multilayer coating structures that particularly combine alternately Al—Cr—B—N and Ti—Al—N individual layers, especially when the thickness of the Al—Cr—B—N individual layers is thicker than the thickness of the Ti—Al—N individual layers, predominantly maintaining basically a ratio of 2:1 concerning the thickness of the Al—Cr—B—N individual layers related to the thickness of the Ti—Al—N individual layers exhibit impressive low residual stresses and impressive high hardness at the same time. Through the addition of Ti—Al—N individual layers it was possible to improve considerably the elasticity of the coating. Consequently the coating adhesion strength, endurance strength and toughness of the coating could be considerably overall improved.

Thus the inventors disclose a coating with low residual stress in combination with enhanced hardness and good tribological properties.

According to an embodiment of the present invention, a combination of Al—Cr—B—N and Ti—Al—N is realized in a multilayer architecture with at least two Ti—Al—N layers and at least two Al—Cr—B—N layers deposited alternately and where the individual layer that is nearest to the substrate surface is a Ti—Al—N layer, and the individual layer that is nearest to the coating surface is an Al—Cr—B—N layer. More preferably at least three Ti—Al—N layers and at least three Al—Cr—B—N layers are deposited alternately. The first Ti—Al—N layer may have a different layer thickness in comparison to the other Ti—Al—N individual layers and may also be deposited direct on the substrate surface in order to be used as adhesion layer. The last Al—Cr—B—N layer may have a different thickness in comparison to the other Al—Cr—B—N individual layers and may also be deposited as outermost layer.

According to a preferred embodiment of the present invention the Al—Cr—B—N/Ti—Al—N multilayer coatings are synthetized by cathodic arc evaporation in $N_2$ atmosphere at 3.5 Pa and 500° C. in an industrial-scale Oerlikon Balzers INNOVA deposition system. In order to form the multilayer architecture, the Al—Cr—B—N layers are deposited from at least one alloyed source material target containing aluminium, chromium and boron with the following element composition: $Al_xCr_yB_z$, where $x+y+z=1$, $x=1.8 \cdot y$ and $0.1 \leq z \leq 0.3$ (x, y and z values are given here in atomic fractions). The Ti—Al—N layers are deposited from at least one alloyed source material target containing aluminium and titanium. In this preferred embodiment TiAl-targets with element composition of 50:50 in atomic per cent were used. Furthermore the design of the multilayer coating according to this embodiment consists of a 0.3 µm-thick Ti—Al—N first layer deposited on the substrate surface, followed by eight iterations of 0.2 µm Al—Cr—B—N and 0.1 µm Ti—Al—N individual layers deposited alternated (bilayer period thickness of the multilayer: 0.3 µm) and concluding with a 0.8 µm Al—Cr—B—N layer as outermost layer, resulting in an overall coating thickness of around 3.5 µm.

X-ray diffraction revealed that all coatings exhibit a face-centered cubic structure in the as-deposited state. X-ray photoelectron spectroscopy showed peaks indicating the formation of a $B_xN_y$ phase in the Al—Cr—B—N outermost layer.

It was also observed that increasing B content results in a grain refinement.

After examination of mechanical and tribological properties of different Al—Cr—B—N coatings deposited as simple monolayer coatings by varied element compositions and thickness, it could be determined that Al—Cr—B—N monolayer coatings exhibit maximal hardness of around 43 GPa by basically residual stresses of around −1.5 GPa, and good resistance against wear.

Similar examinations of mechanical and tribological properties were also carried out in coatings synthetized according to the present invention. In order to obtain representative conclusions about the advantages of Al—Cr—B—N/Ti—Al—N multilayer coatings synthetized according to the present invention in comparison to Al—Cr—B—N monolayer coatings, the Al—Cr—B—N individual layers of the multilayer coatings were synthetized by analogical coating parameters as those used by the deposition of the examined Al—Cr—B—N monolayer coatings. For the comparison, the Al—Cr—B—N/Ti—Al—N multilayer coatings synthetized according to the present invention were deposited with similar overall coating thickness as the analogical Al—Cr—B—N monolayer coatings.

In the context of this patent specification the word analogical is used to relate Al—Cr—B—N monolayer coatings and Al—Cr—B—N/Ti—Al—N multilayer coatings whose:
respective Al—Cr—B—N layers are deposited by same coating parameters and using same type of source material targets with equal targets element composition, and overall coating thickness is almost equal.

The comparison revealed a significant improvement of mechanical and tribological properties.

Especially astonishing were the obtained combination of a very high hardness and very low residual stress at the same time exhibited by the multilayer coatings synthetized according to the present invention.

Multilayer coatings synthetized according to the present invention using alloyed source material targets $Al_xCr_yB_z$ with z values between 0.15 and 0.25 for the deposition of the Al—Cr—B—N individual layers exhibited the best mechanical and tribological properties. Very low residual stresses of around −0.25 GPa and enhanced hardness of around 50 GPa as well as improved tribological properties, including wear coefficients in the range of $4\times10^{-16}$ m$^3$/Nm at 500° C. could be measured.

Particularly because of the extremely low residual stresses and consequently the overall improved coating adhesion strength and endurance strength observed by the Al—Cr—B—N/Ti—Al—N multilayer coatings synthetized according to the present invention a further preferred embodiment of the invention is the synthesis of Al—Cr—B—N/Ti—Al—N multilayer coatings with relative thick coating thickness in comparison to conventional physical vapour deposition processes deposited by means of for example sputter and arc evaporation methods. According to this embodiment of the present invention the Al—Cr—B—N/Ti—Al—N multilayer coatings are deposited having an overall coating thickness equal or thicker than 3 µm, preferably equal or thicker than 5 µm. Coating thicknesses thicker than 10 µm, 20 µm and even up to 30 µm can be realized and the coatings still preserve their excellent properties as described above. In some applications such thicknesses are preferred as it even may further increase the livetime. Even higher thicknesses than 30 µm can be realized.

According to a further preferred embodiment of the present invention the Al—Cr—B—N/Ti—Al—N multilayer coating, the coating is synthetized by reactive cathodic arc evaporation. Due to the deposition using arc evaporation, macro particles of metallic materials from target are present in the coating, which significantly deviate in their composition and properties from the rest of the coating. This is a result of the typical production of droplets which did not fully react with the reactive gas during arc evaporation. These macro particles (droplets) may be kept small enough that they don't worsen the mechanical, thermal, chemical and tribological properties of the Al—Cr—B—N/Ti—Al—N multilayer coatings synthetized according to the present invention. However at the same time these macro particles still contribute to improve the overall coating endurance strength by adding plasticity.

According to a further preferred embodiment of the present invention the Al—Cr—B—N/Ti—Al—N multilayer coating is a nano-laminated coating, whose Al—Cr—B—N individual layers having a thickness≤100 nm, preferably having a bilayer period of the Al—Cr—B—N and Ti—Al—N nanolayers between 75 and 15 nm.

According to a further preferred embodiment of the present invention the Al—Cr—B—N/Ti—Al—N multilayer coating, the coating contains an additional adhesion layer for a further improvement of the coating adhesion to substrate and/or an additional outermost layer or toplayer that can be for example a decorative layer or running-in layer.

According to a further preferred embodiment of the present invention the Al—Cr—B—N/Ti—Al—N multilayer coating, the coating having in the coating thickness direction at least one area with a thickness of at least 1 µm where the Al—Cr—B—N/Ti—Al—N multilayer architecture is characterized in that the bilayer period of the Al—Cr—B—N and Ti—Al—N individual layers is constant.

According to a further preferred embodiment of the present invention the Al—Cr—B—N/Ti—Al—N multilayer coating, the coating having in the coating thickness direction at least one Al—Cr—B—N/Ti—Al—N multilayer architecture area with constant bilayer period as defined in the previous embodiment and having in addition at least one Ti—Al—N layer with different thickness as the Ti—Al—N individual layers contained in the at least one multilayer architecture area with constant bilayer period.

According to a further preferred embodiment of the present invention the Al—Cr—B—N/Ti—Al—N multilayer coating, the coating having in the coating thickness direction at least one Al—Cr—B—N/Ti—Al—N multilayer architecture area with constant bilayer period as defined in the previous embodiment and having in addition at least one Al—Cr—B—N layer with different thickness as the Al—Cr—B—N individual layers contained in the at least one multilayer architecture area with constant bilayer period.

Disclosed is a multilayer coating system deposited on at least a portion of a solid body surface and containing in the multilayer architecture Al—Cr—B—N individual layers deposited by means of a physical vapour deposition method characterized in that in at least a portion of the overall thickness of the multilayer coating system the Al—Cr—B—N individual layers are combined with Ti—Al—N individual layers, wherein the Al—Cr—B—N and Ti—Al—N individual layers are deposited alternately one on each other, and wherein the thickness of the Al—Cr—B—N individual layers is thicker than the thickness of the Ti—Al—N individual layers, and thereby the residual stress of the multilayer coating system is considerably lower in comparison to the residual stress of the corresponding analogical Al—Cr—B—N monolayer coating system and preferably the hardness of the multilayer coating system is larger or equal to the hardness of the corresponding analogical Al—Cr—B—N monolayer coating In the multilayer coating system as mentioned before the thickness ratio of the Al—Cr—B—N individual layers related to the Ti—Al—N individual layers in the coating portion where the Al—Cr—B—N and Ti—Al—N individual layers are deposited alternately one on each other can be basically 2:1.

In the multilayer coating system as mentioned before the layer composition of the Al—Cr—B—N layers contained in the coating portion where the Al—Cr—B—N and Ti—Al—N individual layers are deposited alternately one on each other can be $Al_a Cr_b B_c N_d$ with a+b+c=1, a=9/5·y, 0.1≤z 0.3 where a, b and c are the atomic fractions determined after element analysis taking only the elements Al, Cr and B into account for the element balance.

In the multilayer coating system as mentioned before c the coating portion where the Al—Cr—B—N and Ti—Al—N individual layers are deposited alternately one on each other can contain at least two Ti—Al—N and two Al—Cr—B—N individual layers, more preferably at least three Ti—Al—N and three Al—Cr—B—N individual layers.

In the multilayer coating system as mentioned before the thickness of the Ti—Al—N and Al—Cr—B—N individual layers in the coating portion where the Al—Cr—B—N and Ti—Al—N individual layers are deposited alternately one on each other preferably remains constant.

In the multilayer coating system as mentioned before the element composition of the Al—Cr—B—N individual layers in the coating portion where the Al—Cr—B—N and Ti—Al—N individual layers are deposited alternately one on each other preferably constant.

In the multilayer coating system as mentioned before the Al—Cr—B—N and Ti—Al—N individual layers in the coating portion where the Al—Cr—B—N and Ti—Al—N individual layers are deposited alternately one on each other can be nano-layers whose corresponding individual thicknesses are each one≤100 nm, preferably the bilayer period defined as the sum of the thicknesses corresponding to one Al—Cr—B—N and one Ti—Al—N individual nano-layer is ≤100 nm, preferably is the bilayer period between 75 and 15 nm.

In the multilayer coating system as mentioned before an additional Ti—Al—N individual layer can be deposited between the coating portion where the Al—Cr—B—N and Ti—Al—N individual layers are deposited alternately one on each other and the substrate surface and whose values of thickness and elements concentration are equal or different to the corresponding values of the Ti—Al—N individual layers contained in the coating portion where the Al—Cr—B—N and Ti—Al—N individual layers are deposited alternately one on each other.

In the multilayer coating system as mentioned before an additional Al—Cr—B—N individual layer can be deposited between the coating portion where the Al—Cr—B—N and Ti—Al—N individual layers are deposited alternately one on each other and the coating surface and whose values of thickness and elements concentration are equal or different to the corresponding values of the Al—Cr—B—N individual layers contained in the coating portion where the Al—Cr—B—N and Ti—Al—N individual layers are deposited alternately one on each other.

In the multilayer coating system as mentioned before the additional Ti—Al—N individual layer can be deposited directly on the substrate surface and/or the additional Al—Cr—B—N individual layer is deposited as outermost layer.

In the multilayer coating system as mentioned before an additional adhesion layer not consisting of Ti—Al—N can be deposited directly on the substrate surface to improve the coating adhesion to substrate and/or an additional outermost layer not consisting of Al—Cr—B—N is deposited on the coating surface as top layer, this layer can be for example a thin decorative layer or a running-in layer.

In the multilayer coating system as mentioned before the overall coating thickness of the multilayer coating system can be chosen to be equal or thicker than 3 µm, preferably equal or thicker than 5 µm. Also the overall coating thickness can be chosen to be equal or thicker than 10 µm, 20 µm, and even up to 30 µm or thicker according to the application requirements.

In the multilayer coating system as mentioned before at least the coating portion where the Al—Cr—B—N and Ti—Al—N individual layers are deposited alternately one on each other is preferably synthetized by reactive cathodic arc evaporation. Due to the deposition using arc evaporation macro particles of metallic materials from target are present in the coating, which significantly deviate in their composition and properties from the rest of the coating. These macro particles contribute to improve the overall coating endurance strength by adding elasticity and they don't worsen the mechanical, thermal, chemical and tribological properties of the Al—Cr—B—N/Ti—Al—N multilayer coatings.

In the multilayer coating system as mentioned before at least the coating portion where the Al—Cr—B—N and Ti—Al—N individual layers are preferably deposited alternately one on each other exhibit a face-centered cubic structure in the as-deposited state.

In the multilayer coating system as mentioned before the outermost layer can be an Al—Cr—B—N layer that exhibits the formation of $B_xN_y$.

According to the invention a solid body can be at least partially coated with a multilayer coating system variant of those that was described before. The solid body can be for example a cutting tool or a forming tool or mould or die or a precision component or an automotive component, or a component to be used in the motor industry or in the aerospace industry, like for example a turbine component.

In particular the invention can be used for the following applications:

In particular the invention can be used for the following applications:
1. Tools:
  disposable inserts on the basis of hard metal, cermet, boron nitride, silicon nitride or silicon carbide for milling, turning or drilling
  milling cutters such as ball-headed cutters and end mill cutters
  thread milling cutters
  hob cutters
  shape cutters
  stick blades
  drills
  screw taps
  borers
  engraving tools
  reamers
2. Forming and stamping tools:
  forms for aluminium pressure die casting
  forms for plastic coating
  extrusion dies
  tools for sheet forming
  stamps for stamping metals
  smith's jaws, especially for hot forging
  tools for hot crimping
3. Components and parts especially in the motor industry:
  Valves
  key tappets
  bushing needles
  valve rockers
  tappets
  roller spindles
  rocker fingers
  cam followers
  camshafts
  camshaft bearings
  valve tappets
  tilting levers
  piston rings
  piston pins
  injectors and injector parts
  turbine blades
  pump parts
  high-pressure pump
  gears
  gear wheels
  thrust washer
  components of electric control and acceleration system
  components in ABS system
  bearings
  ball bearings
  roller bearing
  camshaft bearing The invention disclosed in this patent document includes the method for manufacturing a coated solid body with the multilayer coating system described before according to the present invention.

The invention claimed is:

1. A multilayer coating system deposited on at least a portion of a solid body surface and containing in a multilayer architecture Al—Cr—B—N individual layers deposited by means of a physical vapour deposition method characterized in that in at least a portion of the overall thickness of the multilayer coating system at least two Al—Cr—B—N individual layers are combined with at least two Ti—Al—N individual layers, wherein the Al—Cr—B—N and Ti—Al—N individual layers are deposited alternately one on each other, and wherein the thickness of the Al—Cr—B—N individual layers is greater than the thickness of the Ti—Al—N individual layers, and thereby residual stress of the multilayer coating system is considerably lower in comparison to residual stress of a corresponding analogical Al—Cr—B—N monolayer coating system.

2. The multilayer coating system according to claim 1 characterized in that a thickness ratio of the Al—Cr—B—N individual layers related to the Ti—Al—N individual layers in the coating portion where the Al—Cr—B—N and Ti—Al—N individual layers are deposited alternately one on each other is 2:1.

3. The multilayer coating system according to claim 1 characterized in that the layer composition of the Al—Cr—B—N layers contained in the coating portion where the Al—Cr—B—N and Ti—Al—N individual layers are deposited alternately one on each other is $Al_aCr_bB_cN_d$ with $a+b+c=1$, $a=9/5\cdot y$, $0.1\leq z\cdot 0.3$ where a, b and c are the atomic fractions determined after element analysis taking only the elements Al, Cr and B into account for the element balance, and where y and z are atomic fractions of Cr and B for at least one alloyed source material target containing aluminum, chromium and boron with the following element composition, AlxCryBz, where $x+y+z=1$, $x=1.8\cdot y$ and $0.1\leq z\leq 0.3$ with x, y and z values are atomic fractions.

4. The multilayer coating system according to claim 1 characterized in that the thickness of the Ti—Al—N and Al—Cr—B—N individual layers in the coating portion where the Al—Cr—B—N and Ti—Al—N individual layers are deposited alternately one on each other remains constant.

5. The multilayer coating system according to claim 1 characterized in that the element composition of the Al—Cr—B—N individual layers in the coating portion where the Al—Cr—B—N and Ti—Al—N individual layers are deposited alternately one on each other remains constant.

6. The multilayer coating system according to claim 1 characterized in that the Al—Cr—B—N and Ti—Al—N individual layers in the coating portion where the Al—Cr—B—N and Ti—Al—N individual layers are deposited alternately one on each other are nano-layers whose corresponding individual thicknesses are each ≤100 nm.

7. The multilayer coating system according to claim 1 characterized in that an additional Ti—Al—N individual layer is deposited between the coating portion where the Al—Cr—B—N and Ti—Al—N individual layers are deposited alternately one on each other and a substrate surface; and said additional Ti—Al—N individual layer's values of thickness and elements concentration are equal or different to the corresponding values of the Ti—Al—N individual layers contained in the coating portion.

8. The multilayer coating system according to claim 1 characterized in that an additional Al—Cr—B—N individual layer is deposited between the coating portion where the Al—Cr—B—N and Ti—Al—N individual layers are deposited alternately one on each other and the coating surface; and said additional Al—Cr—B—N individual layer's values of thickness and elements concentration are equal or different to the corresponding values of the Al—Cr—B—N individual layers contained in the coating portion.

9. The multilayer coating system according to claim 7 or 8 characterized in that the additional Ti—Al—N individual layer is deposited directly on the substrate surface and/or the additional Al—Cr—B—N individual layer is deposited as outermost layer.

10. The multilayer coating system according to claim 1 characterized in that an additional adhesion layer not consisting of Ti—Al—N is deposited directly on the substrate surface to improve the coating adhesion to substrate and/or an additional outermost layer not consisting of Al—Cr—B—N is deposited on the coating surface as top layer.

11. The multilayer coating system according to claim 1 characterized in that the overall coating thickness of the multilayer coating system is equal or thicker than 3 μm.

12. The multilayer coating system according to claim 1 characterized in that at least the coating portion where the Al—Cr—B—N and Ti—Al—N individual layers are deposited alternately one on each other is synthetized by reactive cathodic arc evaporation, wherein due to the deposition using arc evaporation, macro particles of metallic materials from target are present in the coating.

13. The multilayer coating system according to claim 1 characterized in that at least the coating portion where the Al—Cr—B—N and Ti—Al—N individual layers are deposited alternately one on each other exhibit a face-centered cubic structure in the as-deposited state.

14. The multilayer coating system according to claim 1 characterized in that the outermost layer is an Al—Cr—B—N layer that exhibits the formation of $B_xN_y$, wherein x and y are atomic fractions of B and N, respectively.

15. A solid body at least partially coated with a multilayer coating system according to claim 1.

16. The solid body according to claim 15 characterized in that the solid body is a cutting tool or a forming tool or a stamping tool, or a component or a part of a vehicle, or a component or a part to be used in the motor industry or aerospace industry.

17. The multilayer coating system according to claim 1 wherein the hardness of the multilayer coating system is larger or equal to the hardness of the corresponding analogical Al—Cr—B—N monolayer coating.

18. The multilayer coating system according to claim 1 wherein the coating portion where the Al—Cr—B—N and Ti—Al—N individual layers are deposited alternately one on each other contains at least three Ti—Al—N and three Al—Cr—B—N individual layers.

19. The multilayer coating system according to claim 8 wherein the Al—Cr—B—N and Ti—Al—N individual layers are deposited alternately one on each other.

20. The multilayer coating system according to claim 1 wherein the overall coating thickness of the multilayer coating system is equal or thicker than 5 μm.

* * * * *